United States Patent
Wu et al.

(10) Patent No.: US 11,942,178 B2
(45) Date of Patent: Mar. 26, 2024

(54) SENSE AMPLIFIER CIRCUIT AND METHOD

(71) Applicant: TAIWAN SEMICONDUCTOR MANUFACTURING COMPANY, LTD., Hsinchu (TW)

(72) Inventors: Jui-Jen Wu, Hsinchu (TW); Win-San Khwa, Hsinchu (TW); Jen-Chieh Liu, Hsinchu (TW); Meng-Fan Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 163 days.

(21) Appl. No.: 17/675,901

(22) Filed: Feb. 18, 2022

(65) Prior Publication Data
US 2023/0267970 A1  Aug. 24, 2023

(51) Int. Cl.
G11C 16/04 (2006.01)
G11C 7/06 (2006.01)
G11C 7/08 (2006.01)

(52) U.S. Cl.
CPC .............. *G11C 7/065* (2013.01); *G11C 7/08* (2013.01)

(58) Field of Classification Search
CPC .................................. G11C 7/065; G11C 7/08
See application file for complete search history.

(56) References Cited

U.S. PATENT DOCUMENTS

| | | | |
|---|---|---|---|
| 4,961,166 A * | 10/1990 | Sato | G11C 11/4096 365/207 |
| 6,768,348 B2 | 7/2004 | Shionoiri et al. | |
| 6,795,350 B2 * | 9/2004 | Chen | G11C 29/028 365/210.12 |
| 7,196,953 B2 * | 3/2007 | Takemura | G11C 7/062 365/207 |
| 10,504,567 B2 | 12/2019 | Glazewski et al. | |
| 10,783,696 B2 * | 9/2020 | Cerny | G06T 3/20 |
| 2015/0078103 A1 | 3/2015 | Roy | |

* cited by examiner

*Primary Examiner* — Pho M Luu
(74) *Attorney, Agent, or Firm* — Hauptman Ham, LLP (57) ABSTRACT

A circuit includes a reference voltage node, first and second data lines, a sense amplifier, first and second switching devices coupled between the first and second data lines and first and second input terminals of the sense amplifier, third and fourth switching devices coupled between the first and second data lined and first and second nodes, fifth and sixth switching devices coupled between the first and second nodes and the reference voltage node, and first and second capacitive devices coupled between the first and second nodes and second and first input terminals. Each of the first through fourth switching devices is switched on and each of the fifth and sixth switching devices is switched off in a first operational mode, and each of the first through fourth switching devices is switched off and each of the fifth and sixth switching devices is switched on in a second operational mode.

20 Claims, 5 Drawing Sheets

SENSE AMPLIFIER CIRCUIT AND METHOD

BACKGROUND

Integrated circuits (ICs) often include memory arrays in which stored data are accessed in read operations by sensing voltage differences generated from the stored data. Voltage sense amplifiers have various configurations by which output data are generated based on such voltage differences. Example memory array types include random-access memory (RAM), static random-access memory (SRAM), and dynamic random-access memory (DRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a sense amplifier circuit includes capacitive devices coupled between a data line pair and differential input terminals of a voltage sense amplifier. The circuit includes switching devices configured to charge each of the capacitive devices to a voltage difference on the data lines, then couple the capacitive devices to a reference voltage node so as to amplify the voltage difference input to the sense amplifier. Compared to approaches in which data line voltage differences are directly input to sense amplifiers, the circuit thereby improves sensing and speed margins, particularly when detecting data line voltage differences that are small relative to intrinsic sense amplifier offset voltages.

In accordance with the various embodiments discussed below, FIGS. 1 and 3-5 are schematic diagrams of respective sense amplifier circuits 100 and 300-500, also referred to as circuits 100 and 300-500; FIG. 2 is a diagram of sense amplifier circuit operating parameters; and FIG. 6 is a flowchart of a method 600 of operating a sense amplifier circuit. In various embodiments, a sense amplifier circuit is an integrated circuit (IC), e.g., a portion of a memory circuit. In some embodiments, a sense amplifier circuit is a portion of a RAM, SRAM, or DRAM circuit.

In each of the embodiments discussed below, a sense amplifier circuit is configured to operate in in each of two operational modes corresponding to a read operation of a memory circuit. In the first operational mode, also referred to as a first part of the read operation, switching devices are switched on, i.e., closed, to charge capacitive devices to a voltage difference on a data line pair. In the second operational mode, also referred to as a second part of the read operation, the switching devices are switched off, i.e., opened, the capacitive devices are coupled to a common reference, and a sense amplifier is used to detect the voltage difference as thereby amplified by the capacitive devices.

In the embodiments discussed below, in the second operational mode, the capacitive devices are coupled to a voltage reference node represented in the various figures by an analog ground symbol. In some embodiments, the voltage reference node is configured to have a ground voltage level or a reference voltage level other than a ground voltage level, e.g., a power supply voltage level.

Two or more circuit elements are considered to be coupled based on one or more direct signal connections and/or one or more indirect signal connections that include one or more resistive elements and/or one or more logic devices, e.g., an inverter or logic gate, between the two or more circuit elements. In some embodiments, signal communications between the two or more coupled circuit elements are capable of being modified, e.g., inverted or made conditional, by the one or more logic devices. In some embodiments, two or more circuit elements are considered to be coupled based on a signal connection including one or more capacitive devices, the two or more circuit elements thereby being referred to as capacitively coupled in some embodiments.

Figure 1:
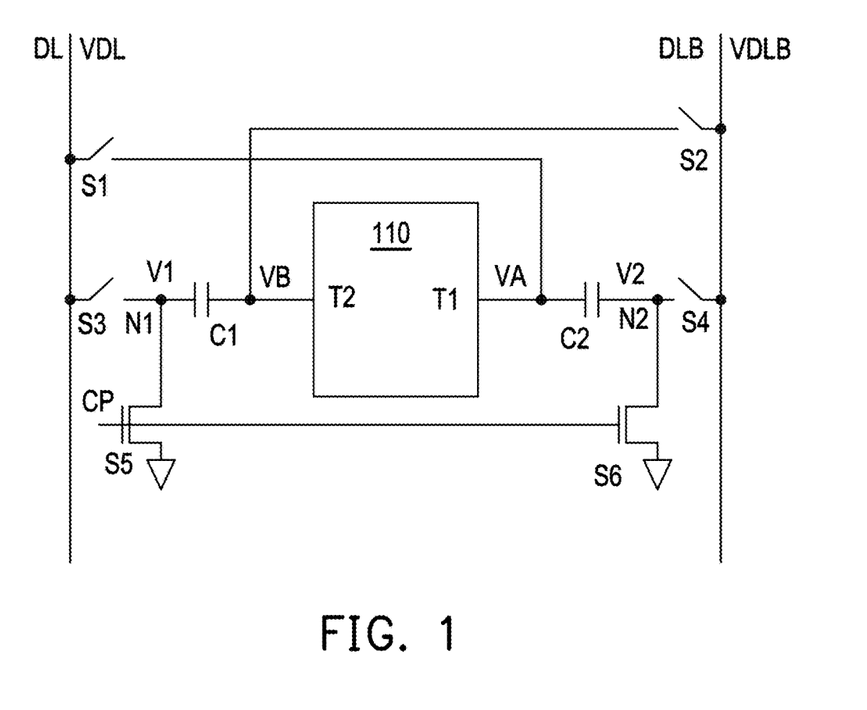
FIG. 1 is a schematic diagram of a sense amplifier circuit, in accordance with some embodiments.
Figure 2:
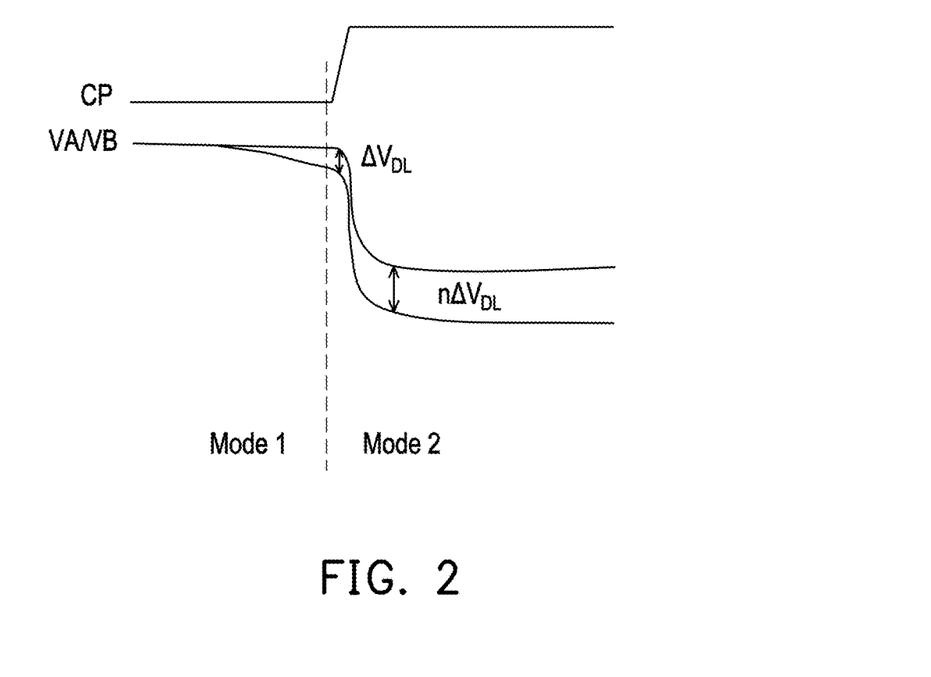
FIG. 2 is a diagram of sense amplifier circuit operating parameters, in accordance with some embodiments.

FIG. 1 is a schematic diagram of circuit 100, in accordance with some embodiments. Circuit 100 includes a sense amplifier 110, data lines DL and DLB, capacitive devices C1 and C2, switching devices S1-S6, and the reference voltage node.

Sense amplifier 110 is an electronic circuit including input terminals T1 and T2 and one or more output terminals (not shown). Sense amplifier 110 is configured to receive a differential voltage at input terminals T1 and T2, and generate one or more output signals (not shown) at the one or more output terminals indicative of a polarity of the differential voltage. In some embodiments, sense amplifier 110 includes one or more latch circuits. In some embodiments, sense amplifier 110 includes sense amplifier 410 or 510 discussed below with respect to FIGS. 4 and 5.

Data lines DL and DLB, also referred to as data line pair DL/DLB in some embodiments, are memory circuit signal lines configured to be coupled to memory cells of the memory circuit in read operations. In some embodiments, data line pair DL/DLB is coupled to a selection circuit (not shown), e.g., a multiplexer, and the memory circuit is configured to couple data line pair DL/DLB to a selected memory cell through the selection circuit in a read operation, e.g., by generating one or more control signals. Data lines DL and DLB are thereby configured to have respective voltages VDL and VDLB in the read operation.

A capacitive device, e.g., capacitive device C1 or C2, is a two-terminal circuit component including one or more IC structures, e.g., a capacitor, configured to have a predetermined capacitance level between the two terminals. In various embodiments, a capacitive device is an IC structure including two or more electrodes separated by corresponding dielectric layers, an n-type transistor having a gate coupled to one of the two terminals and source/drain terminals coupled to each other and to the other of the two terminals, or a p-type transistor having a gate coupled to one of the two terminals and source/drain terminals coupled to each other and to the other of the two terminals. The capacitive device is thereby configured to provide the predetermined capacitance level between the two terminals in operation.

A switching device, e.g., a switching device S1-S6, is an active circuit component including one or more IC structures, e.g., a transistor, configured to selectively couple and decouple two terminals responsive to one or more control signals received at one or more additional terminals, thereby providing a low resistance path in a switched-on state and high resistance path in a switched-off state in operation.

In some embodiments, a switching device incudes an n-type transistor coupled between the two terminals and having a gate configured to receive a control signal, and is thereby configured to, in operation, provide the low resistance path between the two terminals in response to the control signal having the logically high level, and provide the high resistance path between the two terminals in response to the control signal having the logically low level.

In some embodiments, a switching device incudes a p-type transistor coupled between the two terminals and having a gate configured to receive a control signal, and is thereby configured to, in operation, provide the low resistance path between the two terminals in response to the control signal having the logically low level, and provide the high resistance path between the two terminals in response to the control signal having the logically high level.

In some embodiments, a switching device incudes a transmission gate coupled between the two terminals, the transmission gate including two gates configured to receive complementary control signals, and is thereby configured to, in operation, provide the low resistance path between the two terminals in response to the control signal having a first combination of logical levels, and provide the high resistance path between the two terminals in response to the control signal having a second combination of logical levels.

In the embodiments depicted in FIGS. 1 and 3-5, each of switching devices S5 and S6 is an n-type metal-oxide semiconductor (NMOS) transistor. In some embodiments, one or both of switching devices S5 or S6 is a switching device type other than an NMOS transistor, e.g., a p-type metal-oxide semiconductor (PMOS) transistor.

Circuit 100 includes switching device S1 coupled between data line DL and input terminal T1, switching device S2 coupled between data line DLB and input terminal T2, switching device S3 coupled between data line DL and a node N1, switching device S4 coupled between data line DLB and a node N2, switching device S5 coupled between node N1 and the reference voltage node, switching device S6 coupled between node N2 and the reference voltage node, capacitive device C1 coupled between node N1 and input terminal T2, and capacitive device C2 coupled between node N2 and input terminal T1.

Switching devices S2 and S3, and capacitive device C1 coupled between switching devices S2 and S3, are thereby configured as a device series coupled between data lines DL and DLB, with terminal T2 and node N1 corresponding to the two terminals of capacitive device C1.

Switching devices S1 and S4, and capacitive device C2 coupled between switching devices S1 and S4, are thereby configured as a device series coupled between data lines DL and DLB, with terminal T1 and node N2 corresponding to the two terminals of capacitive device C2.

Switching devices S1-S4 are configured to receive one or more control signals (not shown in FIG. 1) whereby switching devices S1-S4 are configured to simultaneously switch on and off such that all four of switching devices S1-S4 have the same ones of the low and high resistance paths over the same time intervals. In various embodiments, switching devices S1-S4 are each a same switching device type, e.g., an NMOS or PMOS transistor, or include multiple switching device types. In various embodiments, switching devices S1-S4 are configured to receive a same control signal or multiple control signals.

In the embodiment depicted in FIG. 1, each of switching devices S5 and S6 is configured to receive a control signal CP whereby switching devices S5 and S6 are configured to simultaneously switch on and off such that both of switching devices S5 and S6 have the same ones of the low and high resistance paths over the same time intervals. In some embodiments, switching devices S5 and S6 are configured to receive different control signals and are thereby configured to simultaneously switch on and off.

Circuit 100 is configured to control switching devices S1-S6, e.g., by including a control circuit configured to generate the one or more control signals including control signal CP, whereby switching devices S1-S4 have the low resistance paths over the time intervals in which switching devices S5 and S6 have the high resistance paths, and switching devices S1-S4 have the high resistance paths over the time intervals in which switching devices S5 and S6 have the low resistance paths.

In the first operational mode, circuit 100 is configured to switch on each of switching devices S1-S4 and switch off each of switching devices S5 and S6 such that each of capacitive devices C1 and C2 is coupled to each of data lines DL and DLB through two low resistance paths and decoupled from the reference voltage node by the high resistance paths of switching devices S5 and S6.

Based on the low resistance paths of switching devices S1 and S3, voltage VDL on data line DL appears as a voltage V1 at the terminal of capacitive device C1 corresponding to node N1 and as a voltage VA at the terminal of capacitive device C2 corresponding to terminal T1. Based on the low resistance paths of switching devices S2 and S4, voltage VDLB on data line DLB appears as a voltage V2 at the terminal of capacitive device C2 corresponding to node N2 and as a voltage VB at the terminal of capacitive device C1 corresponding to terminal T2.

The first operational mode is illustrated in FIG. 2 as Mode 1, in which control signal CP has the logically low level. In the non-limiting example depicted in FIG. 2, sense amplifier 110 has an initialized state at the start of the Mode 1 such that voltages VA and VB (represented as VA/VB) initially have a same voltage level indicated by a single line. As each of capacitive devices C1 and C2 is charged by the voltage levels on data lines DL and DLB, voltages VA and VB diverge to reach a differential voltage value $\Delta V_{DL}$ having a magnitude equal to |VDL-VDLB|.

By the configuration of circuit 100, a polarity of differential voltage $\Delta V_{DL}$ across capacitive device C1 relative to voltage V1 at node N1 is opposite a polarity of differential voltage $\Delta_{VDL}$ across capacitive device C2 relative to voltage V2 at node N2.

In the second operational mode, illustrated in FIG. 2 as Mode 2, circuit 100 is configured to switch off each of switching devices S1-S4 such that each of capacitive devices C1 and C2 is decoupled from each of data lines DL and DLB through two high resistance paths. Control signal CP transitions to the logically high level, thereby switching on each of switching devices S5 and S6 and coupling each of nodes N1 (a terminal of capacitive device C1) and N2 (a terminal of capacitive device C2) to the reference voltage node by a corresponding low resistance path.

Each of the terminals of capacitive devices C1 and C2 is thereby coupled to the reference voltage node such that each of voltages V1 and V2 is driven to the reference voltage level. Based on the opposite polarities of differential voltage $\Delta V_{DL}$ across capacitive device C1 relative to voltage V1 and across capacitive device C2 relative to voltage V2, the difference between voltages VA and VB at respective terminals T1 and T2 is thereby driven to a magnitude equal to approximately twice the magnitude of differential voltage $\Delta V_{DL}$. This magnitude is represented in FIG. 2 as $n\Delta V_{DL}$ for the case in which n=2.

Circuit 100 is thereby configured to charge each of capacitive devices C1 and C2 to voltage difference $\Delta V_{DL}$ on data line pair DL/DLB in the first operational mode, then couple capacitive devices C1 and C2 to the reference voltage node in the second operational mode so as to amplify the voltage difference between voltages VA and VB input to sense amplifier 110. Compared to approaches in which data line voltage differences are directly input to sense amplifiers, circuit 100 thereby improves sensing and speed margins, particularly when detecting data line voltage differences that are small relative to intrinsic sense amplifier offset voltages.

Figure 3:
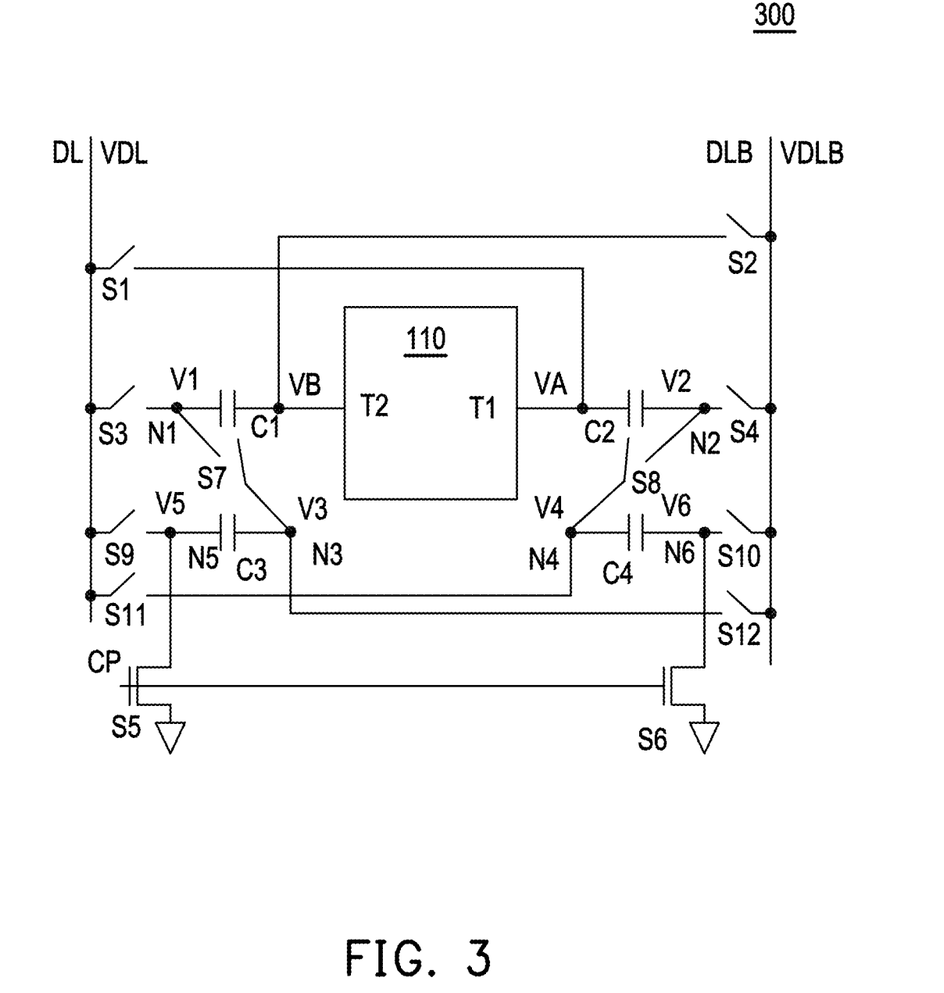
FIG. 3 is a schematic diagram of a sense amplifier circuit, in accordance with some embodiments.

FIG. 3 is a schematic diagram of circuit 300, in accordance with some embodiments. Circuit 300 includes sense amplifier 110, data lines DL and DLB, capacitive devices C1 and C2, switching devices S1-S6, nodes N1 and N2, and the reference voltage node, each discussed above with respect to FIGS. 1 and 2. The elements common to circuit 100 are configured as discussed above except that switching devices S5 and S6 are not directly coupled to respective nodes N1 and N2. Circuit 300 also includes capacitive devices C3 and C4, switching devices S7-S12, and nodes N3-N6.

Circuit 300 includes switching device S7 coupled between nodes N1 and N3, switching device S8 coupled between nodes N2 and N4, switching device S9 coupled between data line DL and node N5, switching device S10 coupled between data line DLB and node N6, switching device S11 coupled between data line DL and node N4, switching device S12 coupled between data line DLB and node N3, capacitive device C3 coupled between nodes N3 and N5, and capacitive device C4 coupled between nodes N4 and N6. Switching device S5 is coupled between node N5 and the reference voltage node, and switching device S6 is coupled between node N6 and the reference voltage node.

Switching devices S9 and S12, and capacitive device C3 coupled between switching devices S9 and S12, are thereby configured as a device series coupled between data lines DL and DLB, with nodes N3 and N5 corresponding to the two terminals of capacitive device C3.

Switching devices S10 and S11, and capacitive device C4 coupled between switching devices S10 and S11, are thereby configured as a device series coupled between data lines DL and DLB, with nodes N4 and N6 corresponding to the two terminals of capacitive device C4.

Circuit 300 is configured to control switching devices S1-S6 as discussed above with respect to FIG. 1. Circuit 300 is configured to also control switching devices S9-S12 to have the low and high resistance paths over the same time intervals as switching devices S1-S4, and to control switching devices S7 and S8 to have the low and high resistance paths over the same time intervals as switching devices S5 and S6.

In the first operational mode, circuit 300 is configured to switch on each of switching devices S1-S4 and S9-S12 and switch off each of switching devices S5-S8 such that each of capacitive devices C1-C4 is coupled to each of data lines DL and DLB through two low resistance paths and decoupled from the reference voltage node and an adjacent device series by the high resistance paths of switching devices S5-S8.

Based on the low resistance paths of switching devices S9 and S11, voltage VDL on data line DL appears as a voltage V5 at the terminal of capacitive device C3 corresponding to node N5 and as a voltage V4 at the terminal of capacitive device C4 corresponding to node N4. Based on the low resistance paths of switching devices S10 and S12, voltage VDLB on data line DLB appears as a voltage V6 at the terminal of capacitive device C4 corresponding to node N6 and as a voltage V3 at the terminal of capacitive device C3 corresponding to node N3.

Differential voltage $\Delta V_{DL}$ on data line pair DL/DLB is thereby provided across capacitive devices C3 and C4 having opposite polarities relative to voltages V5 at node N1 and V6 at node N6.

In the second operational mode, circuit 300 is configured to switch off each of switching devices S1-S4 and S9-S12, thereby decoupling each of capacitive devices C1-C4 from each of data lines DL and DLB, and switch on each of switching devices S5-S8, thereby coupling node N1 to node N3, node N2 to node N4, and each of nodes N5 and N6 (corresponding to terminals of capacitive devices C3 and C4) to the reference voltage node.

Capacitive device C1 is thereby coupled between terminal T2 and capacitive device C3, capacitive device C2 is thereby coupled between terminal T1 and capacitive device C4, and the terminals of capacitive devices C3 and C4 are thereby coupled to the reference voltage node. Thus, voltage V1 is set to equal voltage V3, voltage V2 is set to equal voltage V4, and each of voltages V5 and V6 is driven to the reference voltage level. Based on the polarities of differential voltage $\Delta V_{DL}$ across capacitive device C1 relative to voltage V1/V3, capacitive device C3 relative to voltage V5, capacitive device C2 relative to voltage V2/V4, and capacitive device C4 relative to voltage V6, the difference between voltages VA and VB at respective terminals T1 and T2 is thereby driven to a magnitude equal to approximately four times the magnitude of differential voltage $\Delta V_{DL}$. This magnitude is represented in FIG. 2 as $n\Delta V_{DL}$ for the case in which n=4.

In the embodiment depicted in FIG. 3, circuit 300 includes a total of four device series coupled between data lines DL and DLB such that voltage $\Delta V_{DL}$ is amplified by a factor of four at the input of sense amplifier 110. In some embodiments, circuit 300 includes numbers of device series other than four such that voltage $\Delta V_{DL}$ is amplified by a corresponding factor other than four, e.g., six, at the input of sense amplifier 110. As the total number of device series increases, circuit sensitivity thereby increases along with circuit size and complexity.

Circuit 300 is thereby configured to charge each of multiple capacitive devices, e.g., capacitive devices C1-C4, to voltage difference $\Delta V_{DL}$ on data line pair DL/DLB in the first operational mode, then couple the capacitive devices to the reference voltage node in the second operational mode so as to amplify the voltage difference between voltages VA and VB input to sense amplifier 110, thereby obtaining the benefits discussed above with respect to circuit 100.

Figure 4:
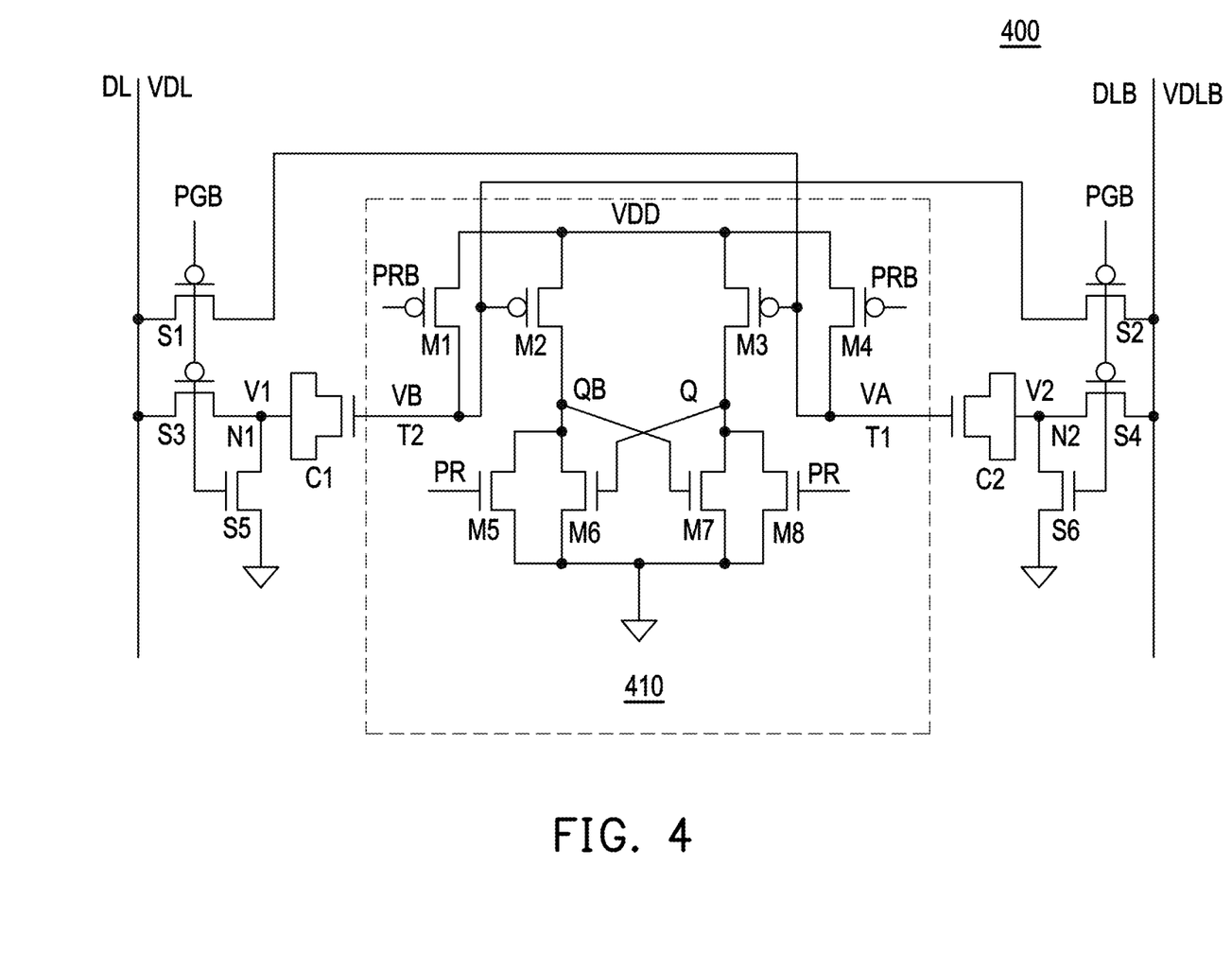
FIG. 4 is a schematic diagram of a sense amplifier circuit, in accordance with some embodiments.
Figure 5:
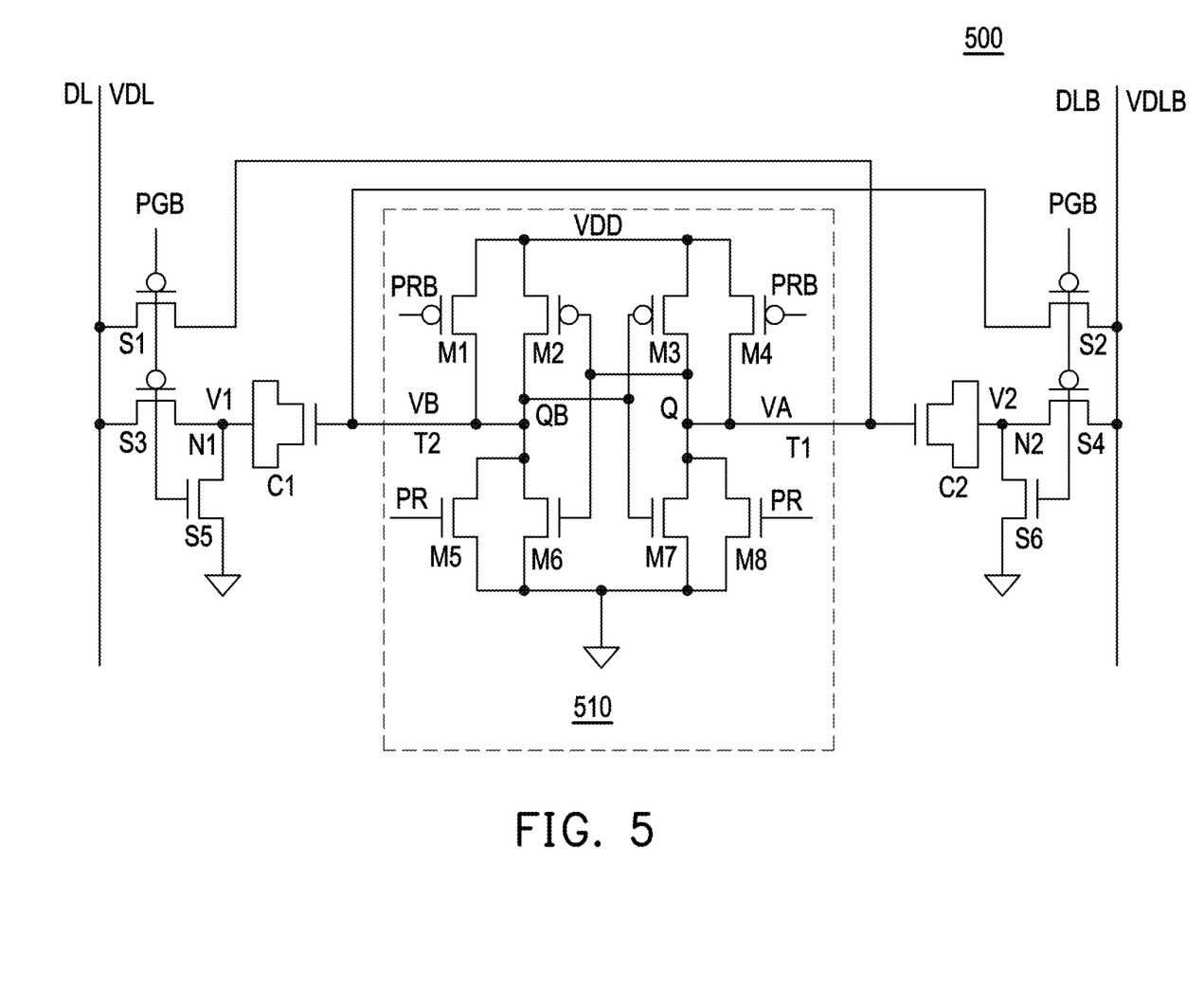
FIG. 5 is a schematic diagram of a sense amplifier circuit, in accordance with some embodiments.
Figure 6:
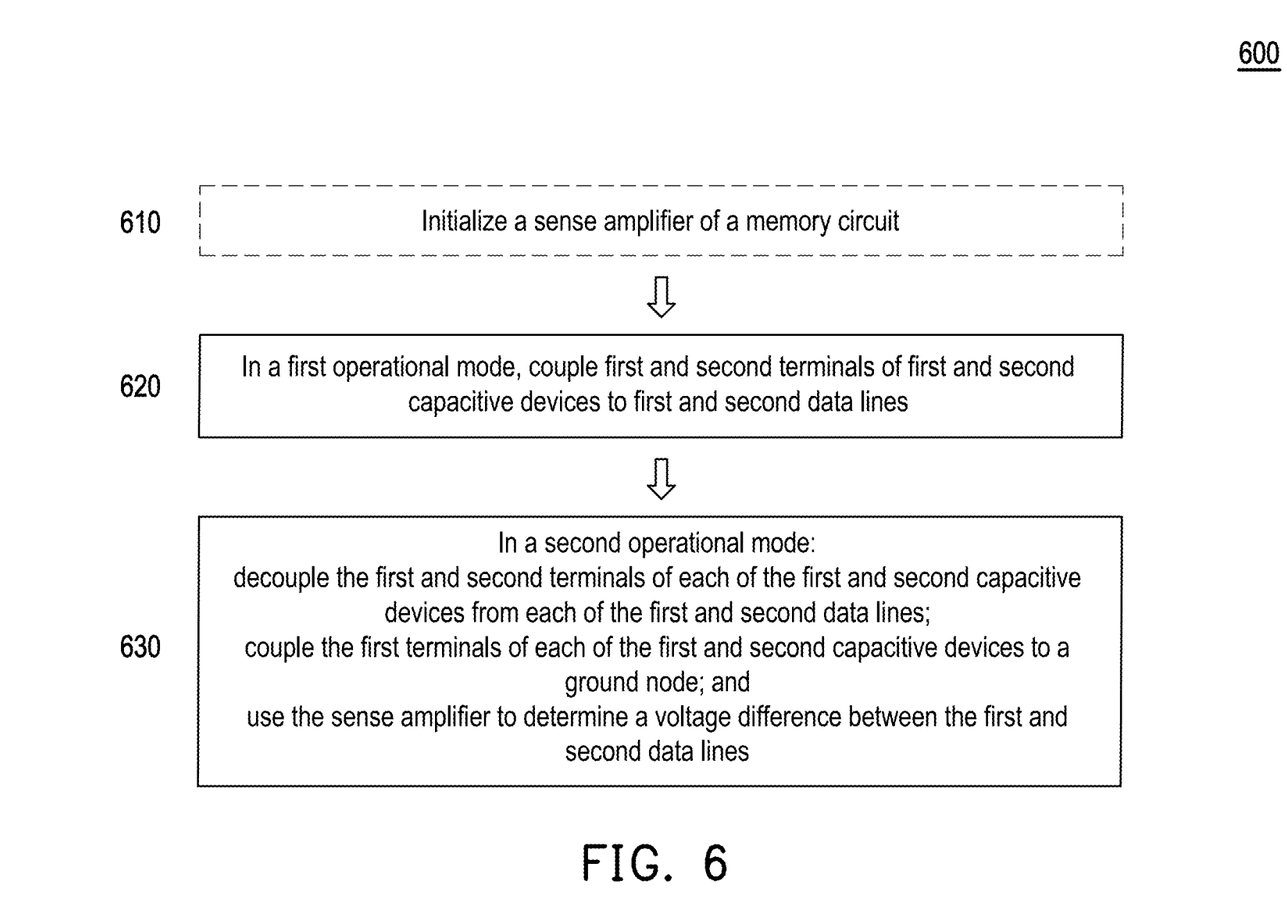
FIG. 6 is a flowchart of a method of operating a sense amplifier circuit, in accordance with some embodiments.

FIGS. 4 and 5 are schematic diagram of respective circuits 400 and 500, in accordance with some embodiments. Each of circuits 400 and 500 includes data lines DL and DLB, capacitive devices C1 and C2, switching devices S1-S6, nodes N1 and N2, and the reference voltage node, each discussed above with respect to FIGS. 1-3. Circuit 400 also includes sense amplifier 410 usable as sense amplifier 110, and circuit 500 includes sense amplifier 510 usable as sense amplifier 110. The elements common to circuit 100 are configured as discussed above, with each of circuits 400 and 500 including non-limiting examples of various elements as discussed below.

In the embodiments depicted in FIGS. 4 and 5, each of circuits 400 and 500 includes each of switching devices S1-S4 including a PMOS transistor, each of switching devices S5 and S6 including an NMOS transistor, each of capacitive devices C1 and C2 including an NMOS transistor, and each of switching devices S1-S6 configured to receive a same control signal PGB. Each of circuits 400 and 500 thereby includes the device series including capacitive device C1 and switching devices S2 and S3 and the device series including capacitive device C2 and switching devices S1 and S4 configured to generate differential voltage VA/VB at terminals T1 and T2 in accordance with the operational modes discussed above with respect to circuit 100. In some embodiments, one or both of circuits 400 or 500 includes one or more device series (not shown) in addition to those depicted in FIGS. 4 and 5 and is thereby configured to generate differential voltage VA/VB at terminals T1 and T2 in accordance with the operational modes discussed above with respect to circuit 300.

In the embodiment depicted in FIG. 4, sense amplifier 410 includes transistors M1-M8, a power supply node configured to have a power supply voltage VDD, output nodes Q and QB, and the reference voltage node. Transistors M1-M4 are PMOS transistors and transistors M5-M8 are NMOS transistors.

Transistors M2 and M6 are coupled in series between the power supply and reference voltage nodes, and drains of transistors M2 and M6 are connected at output node QB. Transistors M3 and M7 are coupled in series between the power supply and reference voltage nodes, and drains of transistors M3 and M7 are connected at output node Q. A gate of transistor M6 is connected to output node Q, and a gate of transistor M7 is connected to output node QB. A gate of transistor M3 includes input terminal T1 configured to receive voltage VA, and a gate of transistor M2 includes input terminal T2 configured to receive voltage VB.

Transistors M2, M3, M6, and M7 are thereby configured as a latch circuit configured to generate voltages at output nodes Q and QB responsive to voltages VA and VB and based on power supply voltage VDD and the reference voltage level.

Transistor M1 is coupled between the power supply voltage node and the gate of transistor M2, transistor M4 is coupled between the power supply voltage node and the gate of transistor M3, transistor M5 is coupled between output node QB and the reference voltage node, and transistor M8 is coupled between output node Q and the reference voltage node. Gates of transistors M5 and M8 are configured to receive a control signal PR, and gates of transistors M1 and M4 are configured to receive a control signal PRB complementary to control signal PR.

Transistors M1, M4, M5, and M8 are thereby configured to perform an initialization operation in which each of transistors M1, M4, M5, and M8 is switched on, thereby causing each of voltages VA and VB to have the value of power supply voltage VDD, and each of output nodes Q and QB to have the reference voltage level.

In the embodiment depicted in FIG. 5, sense amplifier 510 includes transistors M1-M8, the power supply node, output nodes Q and QB, and the reference voltage node. Compared to sense amplifier 410, sense amplifier 510 includes the gate of transistor M2 connected to the gate of transistor M6 and output node Q, and the gate of transistor M3 connected to the gate of transistor M7 and output node QB. Output node Q include terminal T1 configured to receive voltage VA, and output node QB includes input terminal T2 configured to receive voltage VB.

Transistor pairs M2/M6 and M3/M7 are thereby configured as cross-coupled inverters arranged as a latch circuit configured to generate voltages at output nodes Q and QB responsive to voltages VA and VB and based on power supply voltage VDD and the reference voltage level.

Transistors M1, M4, M5, and M8 are configured to perform the initialization operation as discussed above with respect to FIG. 4.

By the configurations discussed above, each of circuits 400 and 500 is capable of performing read operations in accordance with those discussed above and thereby capable of realizing the benefits discussed above with respect to circuits 100 and 300.

FIG. 6 is a flowchart of a method 600 of operating a sense amplifier circuit, in accordance with one or more embodiments. Method 600 is usable with a sense amplifier circuit, e.g., circuit 100 or 300-500 discussed above with respect to FIGS. 1-5.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, the operations of method 600 are part of operating a memory circuit, e.g., a RAM, SRAM, or DRAM array.

At operation 610, in some embodiments, a sense amplifier of a memory circuit is initialized. Initializing the sense amplifier includes setting one or more voltages on one or more nodes and/or terminals to one or more predetermined voltage levels.

In some embodiments, initializing the sense amplifier includes setting each of two differential input terminals to a same voltage level. In some embodiments, setting each of two differential input terminals to the same voltage level includes setting terminals T1 and T2 of sense amplifier 110 to the same voltage level as discussed above with respect to FIGS. 1-3. In some embodiments, setting each of two differential input terminals to the same voltage level includes setting terminals T1 and T2 of sense amplifier 410 or 510 to power supply voltage VDD as discussed above with respect to FIGS. 4 and 5.

At operation 620, in a first operational mode, first and second terminals of first and second capacitive devices are coupled to first and second data lines. In some embodiments, coupling the first and second terminals of the first and second capacitive devices to the first and second data lines includes coupling the terminals of capacitive devices C1 and C2 to data lines DL and DLB as discussed above with respect to FIGS. 1-5.

Coupling the first and second terminals of the first and second capacitive devices to the first and second data lines includes the second terminals of the first and second capacitive devices including the first and second input terminals of the sense amplifier, e.g., terminals T1 and T2 of sense amplifier 110 discussed above with respect to FIGS. 1-3.

Coupling the first and second terminals of the first and second capacitive devices to the first and second data lines includes switching on switching devices coupled between the first and second capacitive devices and the data lines, e.g., switches S1-S4 discussed above with respect to FIGS. 1-5.

In some embodiments, coupling the first and second terminals of the first and second capacitive devices to the first and second data lines is in response to a first logical level of a control signal, e.g., control signal PGB discussed above with respect to FIGS. 4 and 5.

In some embodiments, coupling the first and second terminals of the first and second capacitive devices to the first and second data lines includes coupling first and second terminals of third and fourth capacitive devices to the first and second data lines. In some embodiments, coupling the first and second terminals of the third and fourth capacitive devices to the first and second data lines includes coupling the terminals of capacitive devices C3 and C4 to data lines DL and DLB as discussed above with respect to FIG. 3.

At operation 630, in a second operational mode, the first and second terminals of each of the first and second capacitive devices are decoupled from each of the first and second data lines, the first terminals of each of the first and second capacitive devices are coupled to a reference voltage node, and the sense amplifier is used to determine a voltage difference between the first and second data lines.

In some embodiments, decoupling the first and second terminals of the first and second capacitive devices from the first and second data lines includes decoupling the terminals of capacitive devices C1 and C2 from data lines DL and DLB as discussed above with respect to FIGS. 1-5.

Decoupling the first and second terminals of each of the first and second capacitive devices from each of the first and second data lines includes switching off switching devices coupled between the first and second capacitive devices and the data lines, e.g., switches S1-S4 discussed above with respect to FIGS. 1-5.

In some embodiments, coupling the first terminals of each of the first and second capacitive devices to the reference voltage node includes coupling terminals of capacitive devices C1 and C2 to the reference voltage node as discussed above with respect to FIGS. 1-5.

Coupling the first terminals of each of the first and second capacitive devices to the reference voltage node includes switching on switching devices, e.g., switching devices S5 and S6 discussed above with respect to FIGS. 1-5.

In some embodiments, decoupling the first and second terminals of the first and second capacitive devices from the first and second data lines and coupling the first terminals of each of the first and second capacitive devices to the reference voltage node is in response to a second logical level of a control signal, e.g., control signal PGB discussed above with respect to FIGS. 4 and 5.

In some embodiments, decoupling the first and second terminals of the first and second capacitive devices from the first and second data lines includes decoupling the first and second terminals of each of the third and fourth capacitive devices from each of the first and second data lines, coupling the first terminal of the first capacitive device to the reference voltage node includes capacitively coupling the first terminal of the first capacitive device to the reference voltage node through the third capacitive device, and coupling the first terminal of the second capacitive device to the reference voltage node includes capacitively coupling the first terminal of the second capacitive device to the reference voltage node through the fourth capacitive device.

In some embodiments, decoupling the first and second terminals of the first and second capacitive devices from the first and second data lines includes decoupling the terminals of each of capacitive devices C3 and C4 from each of data lines DL and DLB, capacitively coupling the terminal of first capacitive device C1 to the reference voltage through capacitive device C3, and capacitively coupling the terminal of capacitive device C2 to the reference voltage node through capacitive device C4 as discussed above with respect to FIG. 3.

In some embodiments, using the sense amplifier to determine the voltage difference between the first and second data lines includes using sense amplifier 110 to determine differential voltage $\Delta V_{DL}$ on data lines DL and DLB as discussed above with respect to FIGS. 1-3.

In some embodiments, using the sense amplifier to determine the voltage difference between the first and second data lines includes performing a latch operation based on a first voltage at the first input terminal including a gate of a first PMOS transistor and a second voltage at the second input terminal including a gate of a second PMOS transistor, e.g., performing a latch operation using sense amplifier 410 as discussed above with respect to FIG. 4.

In some embodiments, using the sense amplifier to determine the voltage difference between the first and second data lines includes performing a latch operation based on a first voltage at the first input terminal including a first node of the sense amplifier and a second voltage at the second input terminal including a second node of the sense amplifier, e.g., performing a latch operation using sense amplifier 510 as discussed above with respect to FIG. 5.

By executing some or all of the operations of method 600, a sense amplifier circuit read operation includes charging capacitive devices coupled between a data line pair and differential input terminals of a voltage sense amplifier, then coupling the capacitive devices to a reference voltage node so as to amplify the voltage difference input to the sense amplifier, thereby obtaining the benefits discussed above with respect to circuits 100 and 300-500.

In some embodiments, a circuit includes a reference voltage node, first and second data lines, a sense amplifier including first and second input terminals, a first switching device coupled between the first data line and the first input terminal, a second switching device coupled between the second data line and the second input terminal, a third switching device coupled between the first data line and a first node, a fourth switching device coupled between the second data line and a second node, a fifth switching device coupled between the first node and the reference voltage node, a sixth switching device coupled between the second node and the reference voltage node, a first capacitive device coupled between the first node and the second input terminal, and a second capacitive device coupled between the second node and the first input terminal. The circuit is configured to, in a first operational mode, switch on each of the first through fourth switching devices and switch off each of the fifth and sixth switching devices, and in a second operational mode, switch off each of the first through fourth switching devices and switch on each of the fifth and sixth switching devices.

In some embodiments, a circuit includes a ground node, first and second data lines, a first device series coupled between the first and second data lines, wherein the first device series includes a first NMOS capacitor coupled between first and second switching devices, a second device series coupled between the first and second data lines, wherein the second device series includes a second NMOS capacitor coupled between third and fourth switching devices, a sense amplifier including a first input terminal coupled to a first terminal of the first NMOS capacitor and a second input terminal coupled to a first terminal of the second NMOS capacitor, a first NMOS transistor coupled between a second terminal of the first NMOS capacitor and the ground node, and a second NMOS transistor coupled between a second terminal of the second NMOS capacitor and the ground node. The circuit is configured to, in a first part of a read operation, close each of the first through fourth switching devices and open each of the first and second NMOS transistors, and in a second part of the read operation, open each of the first through fourth switching devices and close each of the first and second NMOS transistors.

In some embodiments, a method of operating a sense amplifier circuit includes, in a first operational mode, coupling first and second terminals of a first capacitive device to first and second data lines, respectively, wherein the second terminal of the first capacitive device includes a first input terminal of a sense amplifier, coupling first and second terminals of a second capacitive device to the second and first data lines, respectively, wherein the second terminal of the second capacitive device includes a second input terminal of the sense amplifier, and in a second operational mode, decoupling the first and second terminals of each of the first and second capacitive devices from each of the first and second data lines, coupling the first terminals of each of the first and second capacitive devices to a reference voltage node, and using the sense amplifier to detect a voltage difference between the first and second data lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit comprising:
a reference voltage node;
first and second data lines;
a sense amplifier comprising first and second input terminals;
a first switching device coupled between the first data line and the first input terminal;
a second switching device coupled between the second data line and the second input terminal;
a third switching device coupled between the first data line and a first node;
a fourth switching device coupled between the second data line and a second node;
a fifth switching device coupled between the first node and the reference voltage node;
a sixth switching device coupled between the second node and the reference voltage node;
a first capacitive device coupled between the first node and the second input terminal; and
a second capacitive device coupled between the second node and the first input terminal,
wherein the circuit is configured to
in a first operational mode, switch on each of the first through fourth switching devices and switch off each of the fifth and sixth switching devices, and
in a second operational mode, switch off each of the first through fourth switching devices and switch on each of the fifth and sixth switching devices.

2. The circuit of claim 1, wherein each of the first capacitive device and the second capacitive device comprises an n-type metal-oxide-semiconductor (NMOS) transistor configured as a capacitor.

3. The circuit of claim 1, wherein each of the first through sixth switching devices comprises a gate configured to receive a same control signal.

4. The circuit of claim 3, wherein
each of the first through fourth switching devices comprises a p-type metal-oxide-semiconductor (PMOS) transistor, and
each of the fifth and sixth switching devices comprises an n-type metal-oxide-semiconductor (NMOS) transistor.

5. The circuit of claim 1, wherein the reference voltage node is configured to have a ground voltage level.

6. The circuit of claim 1, wherein
the sense amplifier comprises a latch circuit comprising first and second p-type metal-oxide-semiconductor (PMOS) transistors,
a gate of the first PMOS transistor comprises the first input terminal, and
a gate of the second PMOS transistor comprises the second input terminal.

7. The circuit of claim 1, wherein
the sense amplifier comprises a latch circuit comprising first and second latch nodes,
the first latch node comprises the first input terminal, and
the second latch node comprises the second input terminal.

8. The circuit of claim 1, further comprising:
a seventh switching device coupled between the first node and a third node;
an eighth switching device coupled between the second node and a fourth node;
a ninth switching device coupled between the first data line and a fifth node;
a tenth switching device coupled between the second data line and a sixth node;

an eleventh switching device coupled between the first data line and the fourth node;
a twelfth switching device coupled between the second data line and the third node;
a third capacitive device coupled between the third and fifth nodes; and
a fourth capacitive device coupled between the fourth and sixth nodes,
wherein
the fifth switching device is coupled between the fifth node and the reference voltage node,
the sixth switching device is coupled between the sixth node and the reference voltage node, and
the circuit is configured to switch on each of the seventh through twelfth switching devices in the first operational mode and switch off each of the seventh through twelfth switching devices in the second operational mode.

9. A circuit comprising:
a ground node;
first and second data lines;
a first device series coupled between the first and second data lines, wherein the first device series comprises a first n-type metal-oxide-semiconductor (NMOS) capacitor coupled between first and second switching devices;
a second device series coupled between the first and second data lines, wherein the second device series comprises a second NMOS capacitor coupled between third and fourth switching devices;
a sense amplifier comprising a first input terminal coupled to a first terminal of the first NMOS capacitor and a second input terminal coupled to a first terminal of the second NMOS capacitor;
a first NMOS transistor coupled between a second terminal of the first NMOS capacitor and the ground node; and
a second NMOS transistor coupled between a second terminal of the second NMOS capacitor and the ground node,
wherein the circuit is configured to
in a first part of a read operation, close each of the first through fourth switching devices and open each of the first and second NMOS transistors, and
in a second part of the read operation, open each of the first through fourth switching devices and close each of the first and second NMOS transistors.

10. The circuit of claim 9, wherein each of the first through fourth switching devices comprises a p-type metal-oxide-semiconductor (PMOS) transistor.

11. The circuit of claim 10, wherein each of the PMOS and first and second NMOS transistors comprises a gate configured to receive a same control signal.

12. The circuit of claim 9, wherein
the sense amplifier comprises:
a first p-type metal-oxide-semiconductor (PMOS) transistor coupled in series with a third NMOS transistor between a power supply node and the ground node; and
a second PMOS transistor coupled in series with a fourth NMOS transistor between the power supply node and the ground node,
a gate of the first PMOS transistor comprises the first input terminal, and
a gate of the second PMOS transistor comprises the second input terminal.

13. The circuit of claim 9, wherein
the sense amplifier comprises cross-coupled first and second inverters,
an input terminal of the first inverter comprises the first input terminal, and
an input terminal of the second inverter comprises the second input terminal.

14. The circuit of claim 9, further comprising:
a third device series coupled between the first and second data lines, wherein the third device series comprises a third NMOS capacitor coupled between fifth and sixth switching devices;
a fourth device series coupled between the first and second data lines, wherein the fourth device series comprises a fourth NMOS capacitor coupled between seventh and eighth switching devices;
a ninth switching device coupled between the second terminal of the first NMOS capacitor and a first terminal of the third NMOS capacitor; and
a tenth switching device coupled between the second terminal of the second NMOS capacitor and a first terminal of the fourth NMOS capacitor,
wherein
the first NMOS transistor is coupled between a second terminal of the third NMOS capacitor and the ground node,
the second NMOS transistor is coupled between a second terminal of the fourth NMOS capacitor and the ground node, and
the circuit is configured to close each of the fifth through tenth switching devices in the first part of the read operation and open each of the fifth through tenth switching devices in the second part of the read operation.

15. A method of operating a sense amplifier circuit, the method comprising:
in a first operational mode:
coupling first and second terminals of a first capacitive device to first and second data lines, respectively, wherein the second terminal of the first capacitive device comprises a first input terminal of a sense amplifier;
coupling first and second terminals of a second capacitive device to the second and first data lines, respectively, wherein the second terminal of the second capacitive device comprises a second input terminal of the sense amplifier; and
in a second operational mode:
decoupling the first and second terminals of each of the first and second capacitive devices from each of the first and second data lines;
coupling the first terminals of each of the first and second capacitive devices to a reference voltage node; and
using the sense amplifier to detect a voltage difference between the first and second data lines.

16. The method of claim 15, wherein
the coupling the first and second terminals of each of the first and second capacitive devices in the first operational mode is in response to a first logical level of a control signal, and
the decoupling the first and second terminals of each of the first and second capacitive devices from each of the first and second data lines and the coupling the first terminals of each of the first and second capacitive devices to the reference voltage node in the second operational mode is in response to a second logical level of the control signal.

17. The method of claim 15, wherein
each of the coupling the first terminal of the first capacitive device to the reference voltage node and the coupling the first terminal of the second capacitive device to the reference voltage node comprises switching on an n-type metal-oxide-semiconductor (NMOS) transistor.

18. The method of claim 15, wherein
the using the sense amplifier comprises performing a latch operation based on a first voltage at the first input terminal comprising a gate of a first p-type metal-oxide-semiconductor (PMOS) transistor and a second voltage at the second input terminal comprising a gate of a second PMOS transistor.

19. The method of claim 15, wherein
the using the sense amplifier comprises performing a latch operation based on a first voltage at the first input terminal comprising a first node of the sense amplifier and a second voltage at the second input terminal comprising a second node of the sense amplifier.

20. The method of claim 15, further comprising:
in the first operational mode, coupling first and second terminals of each of third and fourth capacitive devices to the first and second data lines; and
in the second operational mode, decoupling the first and second terminals of each of the third and fourth capacitive devices from each of the first and second data lines, wherein
the coupling the first terminal of the first capacitive device to the reference voltage node comprises capacitively coupling the first terminal of the first capacitive device to the reference voltage node through the third capacitive device, and
the coupling the first terminal of the second capacitive device to the reference voltage node comprises capacitively coupling the first terminal of the second capacitive device to the reference voltage node through the fourth capacitive device.

* * * * *